United States Patent

Urasaki et al.

[11] Patent Number: 5,834,156
[45] Date of Patent: Nov. 10, 1998

[54] METHOD FOR PROCESSING PHOTOSENSITIVE MATERIAL AND APPARATUS THEREFOR

[75] Inventors: Jun Urasaki; Toshiyuki Morito; Masahiko Saikawa; Yoshikazu Takano; Eiji Kanada, all of Tokyo, Japan

[73] Assignee: Mitsubishi Papers Mills Limited, Tokyo, Japan

[21] Appl. No.: 874,538

[22] Filed: Jun. 13, 1997

Related U.S. Application Data

[63] Continuation of Ser. No. 507,415, filed as PCT/JP94/02296, Dec. 28, 1994, abandoned.

[30] Foreign Application Priority Data

| Dec. 28, 1993 | [JP] | Japan | 5-334028 |
| Apr. 13, 1994 | [JP] | Japan | 6-074675 |
| Sep. 12, 1994 | [JP] | Japan | 6-217502 |
| Oct. 7, 1994 | [JP] | Japan | 6-243874 |
| Oct. 18, 1994 | [JP] | Japan | 6-251807 |
| Oct. 27, 1994 | [JP] | Japan | 6-263012 |
| Oct. 27, 1994 | [JP] | Japan | 6-263014 |

[51] Int. Cl.$^6$ .............. G03C 8/32; G03C 5/29; G03F 7/07; G03D 3/40
[52] U.S. Cl. ............. 430/204; 430/203; 430/207; 430/247; 430/249; 430/350; 430/403; 430/404; 430/963; 396/587; 396/604; 396/606; 396/614; 396/617; 396/638
[58] Field of Search ................ 430/204, 403, 430/404, 203, 207, 350, 963; 396/587, 604, 606, 614, 617, 638

[56] References Cited

U.S. PATENT DOCUMENTS

| 3,728,114 | 4/1973 | Futaki et al. | 430/204 |
| 4,134,769 | 1/1979 | Yoshida et al. | 430/204 |
| 4,160,670 | 7/1979 | Tsubai et al. | 430/204 |
| 4,336,321 | 6/1982 | Kanada et al. | 430/204 |
| 4,501,811 | 2/1985 | Saikawa et al. | 430/204 |
| 4,510,228 | 4/1985 | Tsubai et al. | 430/204 |
| 4,621,041 | 11/1986 | Saikawa et al. | 430/204 |
| 5,307,109 | 4/1994 | Miyasaka et al. | 354/320 |
| 5,387,483 | 2/1995 | Takagi | 430/204 |
| 5,432,042 | 7/1995 | Deprez et al. | 430/204 |
| 5,455,651 | 10/1995 | VerHoest et al. | 354/320 |

FOREIGN PATENT DOCUMENTS

| 47-26201 | 10/1972 | Japan . |
| 48-76603 | 10/1973 | Japan . |
| 54-83502 | 7/1979 | Japan . |
| 56-8145 | 1/1981 | Japan . |
| 56-27151 | 12/1981 | Japan . |
| 57-86835 | 5/1982 | Japan . |
| 57-115549 | 7/1982 | Japan . |
| 58-127928 | 7/1983 | Japan . |
| 58-196548 | 11/1983 | Japan . |
| 61-73951 | 4/1986 | Japan . |
| 63-137233 | 11/1986 | Japan . |
| 62-239160 | 10/1987 | Japan . |
| 2-3064 | 1/1990 | Japan . |
| 2-176654 | 7/1990 | Japan . |
| 2-259643 | 10/1990 | Japan . |
| 4-121750 | 4/1992 | Japan . |
| 4-307244 | 10/1992 | Japan . |

(List continued on next page.)

*Primary Examiner*—Richard L. Schilling
*Attorney, Agent, or Firm*—Cushman, Darby & Cushman IP Group of Pillsbury, Madison & Sutro

[57] ABSTRACT

A method for processing a photosensitive material characterized in that an exposed photosensitive material is subjected to dip coating with a processing solution, according to which there are no problems encountered in plate making by the conventional dip developing method and coating developing method, rapid processing can be attained, maintenance is easy, less waste processing solution is produced, and lithographic printing plates on which uniform print images can be formed from the top end portion thereof by silver complex diffusion transfer process, and an apparatus used for the processing.

30 Claims, 4 Drawing Sheets

FOREIGN PATENT DOCUMENTS

| | | |
|---|---|---|
| 4-307245 | 10/1992 | Japan . |
| 4-307246 | 10/1992 | Japan . |
| 4-323659 | 11/1992 | Japan . |
| 4-323661 | 11/1992 | Japan . |
| 5-278363 | 10/1993 | Japan . |
| 6-222560 | 8/1994 | Japan . |
| 6324451 | 11/1994 | Japan ..................................... 430/204 |
| 1000115 | 8/1965 | United Kingdom . |
| 1012476 | 12/1965 | United Kingdom . |
| 1017273 | 9/1966 | United Kingdom . |
| 1042477 | 9/1966 | United Kingdom . |

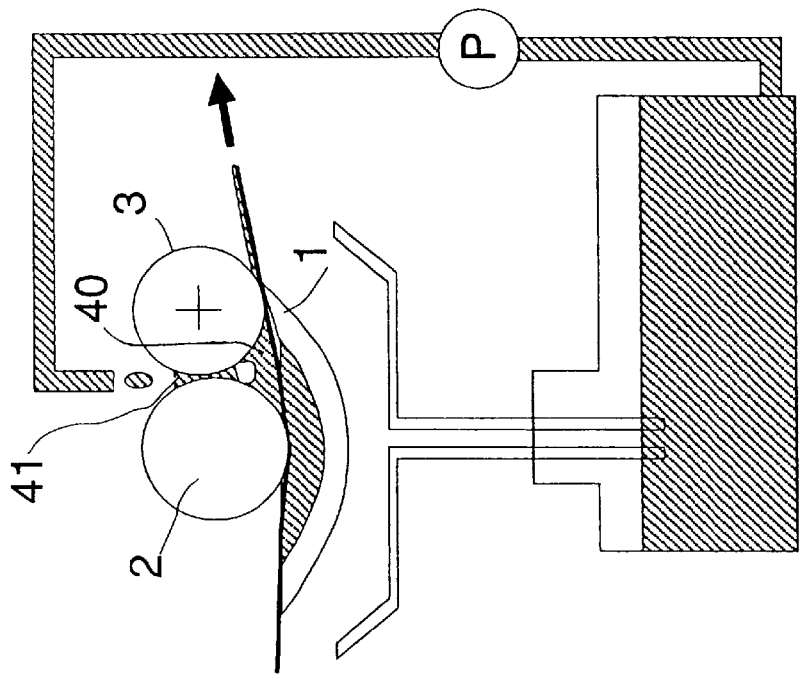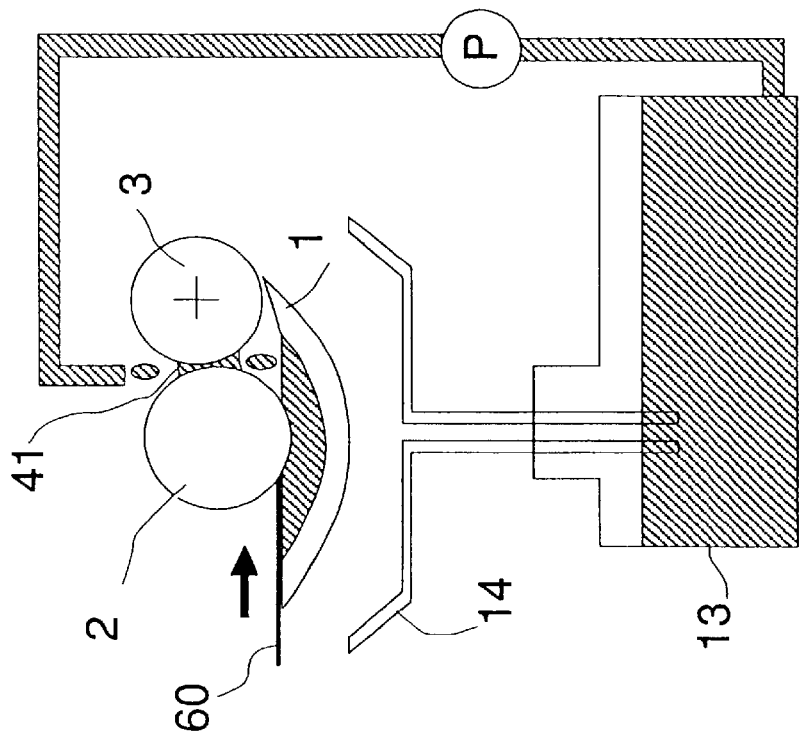

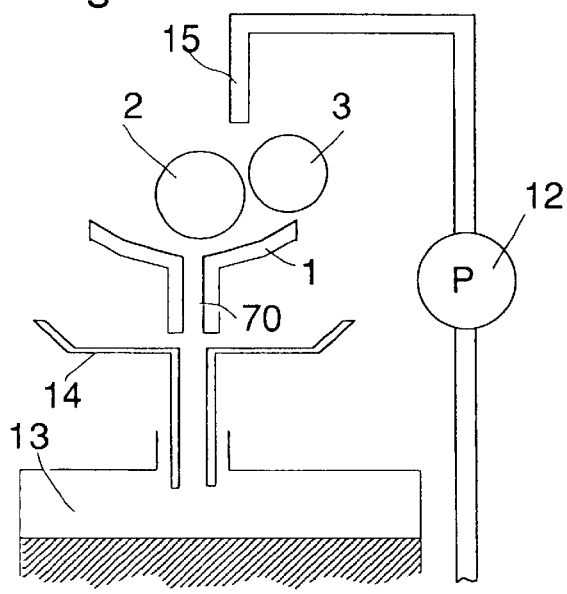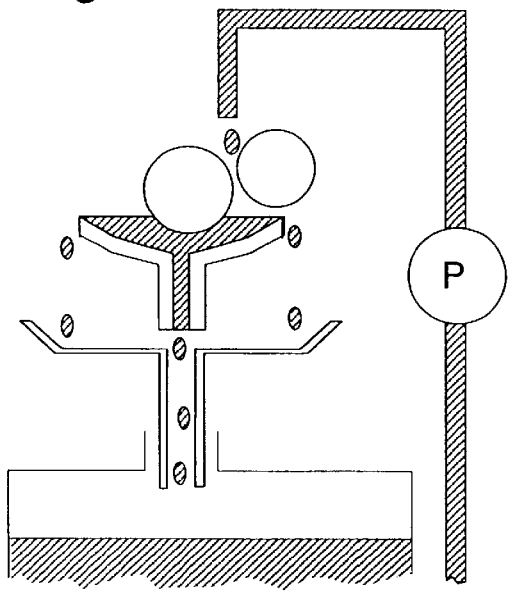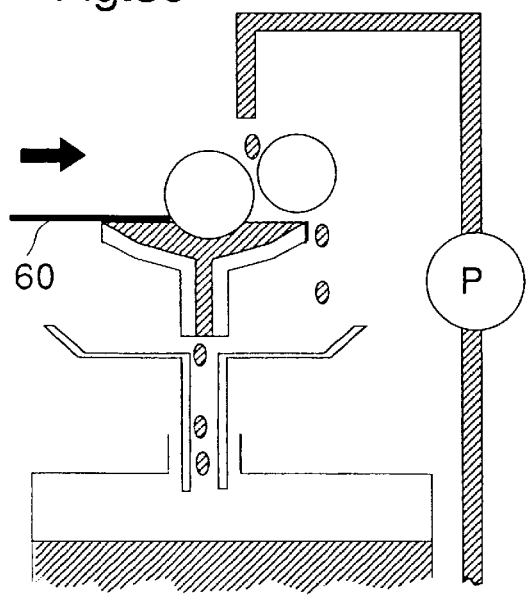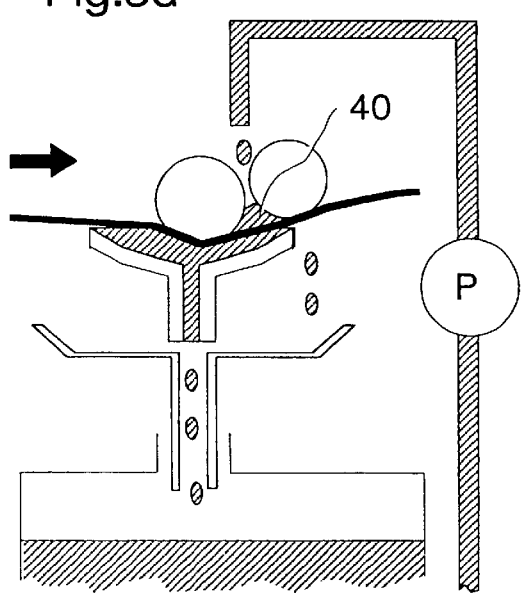

METHOD FOR PROCESSING PHOTOSENSITIVE MATERIAL AND APPARATUS THEREFOR

This is a continuation of Appln. Ser. No. 08/507,415, filed on Aug. 24, 1995, which was abandoned upon the filing hereof; which is a 371 of PCT/JP94/02296, filed Dec. 28, 1994.

TECHNICAL FIELD

The present invention relates to a method for processing photosensitive materials, especially to a method for processing photosensitive lithographic printing plates utilizing silver complex diffusion transfer process and an apparatus used for the processing.

BACKGROUND ART

Photographic photosensitive materials such as films, printing papers and silver salt printing plates are exposed imagewise, developed and then subjected to the treatments such as fixing, stabilization and washing with water. Among them, the photosensitive lithographic printing plates (hereinafter referred to as "lithographic printing plates") are exposed imagewise and then subjected to treatments such as development, stabilization, etc. A lithographic printing plate consists of oleophilic image portions receptive to oily ink and ink repellent non-image portions unreceptive to ink, the non-image portions being generally water receptive hydrophilic areas. The usual lithographic printing is carried out by feeding both water and ink to the surface of the printing plate to allow the image portions to receive preferentially the colored ink and the non-image portions to receive preferentially water and then transferring the ink on the image portions onto a substrate such as paper.

Therefore, in order to obtain prints of good quality, it is necessary that the difference between oleophilicity of the surface of the image portions and hydrophilicity of the surface of the non-image portions is sufficiently large so that when water and ink are applied the image portions can receive sufficient amount of ink while the non-image portions may completely repel the ink.

Lithographic printing plates to which the silver complex diffusion transfer process (DTR process) is applied, especially those which comprise a silver halide emulsion layer and a physical development nuclei layer provided on the emulsion layer are described, for example, in U.S. Patent Nos. 3,728,114, 4,134,769, 4,160,670, 4,336,321, 4,501, 811, 4,510,228 and 4,621,041. The exposed silver halide crystal undergoes chemical development by DTR development to become black silver to form a hydrophilic non-image portion. On the other hand, the unexposed silver halide crystal is converted to a silver complex by the silver salt complexing agent contained in the developer, which then diffuses to the surface physical development nuclei layer and undergoes physical development in the presence of nuclei to form an ink receptive image portion mainly composed of physically developed silver.

In the practical method for making lithographic printing plates, an automatic process camera having a developing tank and a stabilizing tank (neutralizing tank) is used. However, the plate making method using the process camera is not satisfactory from the point of rapid processing and besides, the method is troublesome in maintenance. Furthermore, from the point of environmental problems, development of more rapid and substantially maintenance-free plate making systems which produce less or no waste processing solution has been demanded. Moreover, the conventional developing method using a developing tank have many defects such as decrease of pH and reduction of developing speed due to continuation of the developing process, generation of silver sludge, generation of drag patterns due to movement of the developer and drifting of images due to flowing of silver complex, even in the case of the developing method described in U.S. Pat. No. 5,307,109 in which a relatively small developing tank is employed.

On the other hand, Japanese Patent Kokai (Laid-Open) Nos. 48-76603, 57-115549 and 4-307245 disclose plate making methods in which a developer in an amount necessary to develop lithographic printing plates is coated on only the photosensitive surface of the printing plates. However, according to these developing methods by coating, if uniform development is effected with a developer in an amount substantially necessary for development, actually a considerable amount of a surplus developer is needed; complicated and expensive apparatuses are required; furthermore, uniform coating cannot be performed and the methods lack stability. That is, they have these serious problems.

A rapid processing method aiming at the improvement of the above problems is disclosed in Japanese Patent Kokai (Laid-Open) No. 4-307246. This method is a pickup roller coating method in which the rotating speed of the pickup roller for solution is higher than the delivery speed of lithographic printing plates to form a reservoir for processing solution between the lithographic printing plate and the solution pickup roller. However, according to this method, the size of the reservoir is affected by the viscosity of the processing solution or the processing speed and a sufficiently stable reservoir cannot be formed and thus, printing plates of stable quality cannot be obtained. Furthermore, U.S. patent application Ser. No. 08/086848 discloses a method of processing which comprises supplying a developer at above a pair of non-rotating rollers to form a reservoir at the nip of the rollers and coating the developer on a photosensitive material. However, according to this method, since a small amount of the developer collected at the nip of the pair of rollers is coated on only the photosensitive surface of the photosensitive material, amount of the coated developer comes short of and the development is insufficient or uneven development occurs.

SUMMARY OF THE INVENTION

The object of the present invention is to provide a processing method of photosensitive materials suitable for making lithographic printing plates using the silver complex diffusion transfer process which is free from the problems encountered in the conventional processing method using a processing tank or the conventional coating developing method; which makes it possible to perform rapid and stable processing with an extremely small amount of processing solution; which is convenient in maintenance; which produces less waste processing solution; and which can produce uniform images even on the top end portion of the photosensitive materials and to provide an apparatus used therefor.

BRIEF DESCRIPTION OF THE DRAWINGS

FIGS. 2a and 2b are schematic sectional views of an essential portion of the developing part of the apparatus shown in FIG. 1.

FIGS. 3a, 3b, 3c and 3d are schematic sectional views of an essential portion of the developing part of another embodiment of the apparatus differing from one shown in FIGS. 2a and 2b.

Figure 1:
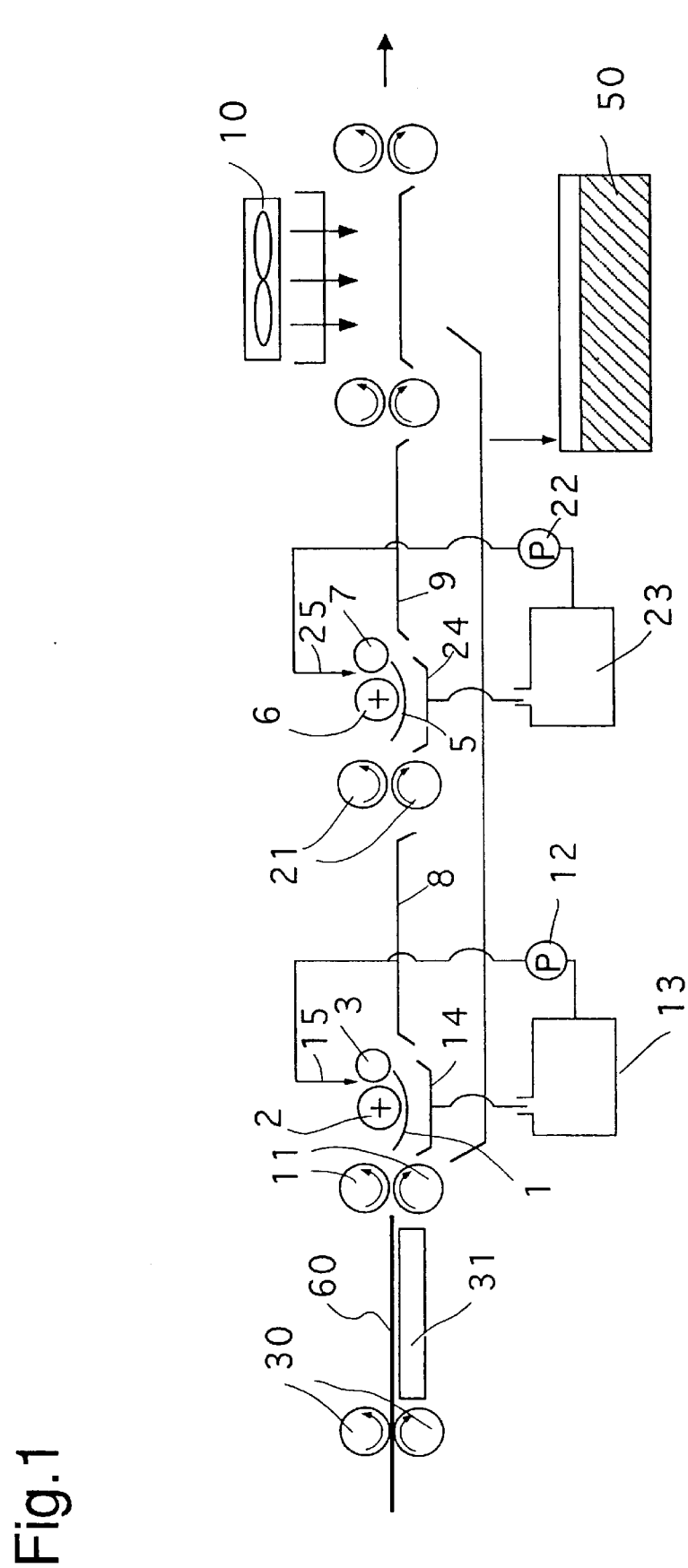
FIG. 1 is a schematic sectional view of one example of the automatic developing apparatus of the present invention.

In the drawings, the reference numerals have the following meanings.

1 Reservoir trough
2 Guide roller for photosensitive material
3 Reservoir forming means
8 Reaction maintaining guide which also serves as delivery guide
12 Developer circulating pump
13 Intermediate developer tank
14 Developer recovering pan
15 Developer supplying means

BEST MODE FOR CARRYING OUT THE INVENTION

In this specification, "dip coating the photosensitive material with a processing solution" means an embodiment of processing according to which the photosensitive material is delivered in such a manner that at least the top end portion of the photosensitive material passes through the processing solution in an extremely short time and is discharged out of the system (namely, into air). The processing method of the present invention can form a uniform transfer silver image having sufficient printing endurance even in the top end portion of the photosensitive material as compared with conventional processing methods.

The present invention will be explained in more detail using the representative processing apparatus used for the process of the present invention. One example of a specific processing apparatus used in the present invention which will be explained in detail hereinafter is an apparatus having at least a small processing solution reservoir trough for processing a photosensitive material, a photosensitive material guiding means for guiding the photosensitive material so that it passes through the processing solution near the surface of the solution and a reservoir forming means provided in the vicinity of the photosensitive material guiding means.

According to the processing method of the present invention using the above processing apparatus, since the reservoir of the processing solution formed on the photosensitive surface of the photosensitive material by the reservoir forming means is a processing solution which is continuous with and is one with the processing solution in the reservoir trough, the photosensitive material carried in the reservoir trough is subjected to dip coating in a short time of from being introduced into the processing solution by the photosensitive material guiding means to being discharged from the reservoir forming means out of the processing solution (into air). Therefore, the reservoir trough is designed to have a very narrow width in the carrying direction of the photosensitive material. The reservoir trough for the processing solution is preferably shallow in the depth and slender and is far smaller in volume of the processing solution as compared with the conventional reservoir trough. Accordingly, in general, the photosensitive material sheet for lithographic printing plate cannot be processed up to the back end of the sheet only with the processing solution in such volume as stored in a small reservoir trough, but such volume of the processing solution is sufficient for dip coating of the portion of about 2–20 cm from the top end of the photosensitive material though it depends on the size of the photosensitive material. In order to process the remainder of the photosensitive material up to the back end, the processing solution reduced by the processing is continuously replenished by a solution supplying means at least during the processing of the photosensitive material. For example, by supplying the processing solution at above and between the photosensitive material guiding means and the reservoir forming means, the amount of the solution of the reservoir and furthermore, the level of the solution in the reservoir trough can be kept constant.

Since the photosensitive material passes through the processing solution in the reservoir trough n an extremely short time, amount of the processing solution taken up by the photosensitive material per unit area is generally not sufficient for rapid processing, and the reservoir formed on the photosensitive surface of the photosensitive material is for attaining further stable dip coating of the processing solution. The reservoir forming means also serves to adjust at constant the amount of the processing solution supplied for dip coating of the photosensitive material. The reservoir trough for processing solution is more preferably a temporary reservoir trough which stores the processing solution only at the time of processing. According to another preferred embodiment, the processing solution in the reservoir trough is in the state of overflowing the trough at least at the time of processing.

In one example of the apparatus of the present invention, it is designed so that the top end of the photosensitive material which is horizontally carried above the surface of the processing solution runs against the photosensitive material guiding means which is slightly dipped in the processing solution and then the photosensitive material is guided so as to be dipped into the processing solution along the guiding means, and at the time of the photosensitive material leaving the processing solution, the photosensitive surface of the material takes up the processing solution and simultaneously a reservoir of the processing solution is formed between the photosensitive material guiding means and the reservoir forming means.

In the processing method of the present invention, the time for which the photosensitive material is dipped in the processing solution or the time of from the photosensitive material being dipped in the processing solution to the photosensitive material leaving the reservoir forming means is a time measured at a specific point (for example, top end) of the photosensitive material and is an extremely short period, preferably about 1.5 second or shorter, and typically about 1 second and such short-time processing hardly causes decrease of pH value and generation of silver sludge in developing.

The processing method and the processing apparatus of the present invention having the characteristics as mentioned above have no defects as encountered in both the conventional dip development and the coating development, can effect rapid and stable processing with an extremely small amount of the processing solution, are superior in maintenance, produce less amount of waste solution and furthermore can form uniform images even on the front end portion of the photosensitive material, and thus are suitable for processing of lithographic printing plates and as processing apparatuses of lithographic printing plates which utilize the silver complex diffusion transfer process.

The present invention is preferably applied to development treatment, but may also be applied to stabilization treatment, fixing treatment and the like and besides, may be applied to a plurality of the treatments.

Figure 4:
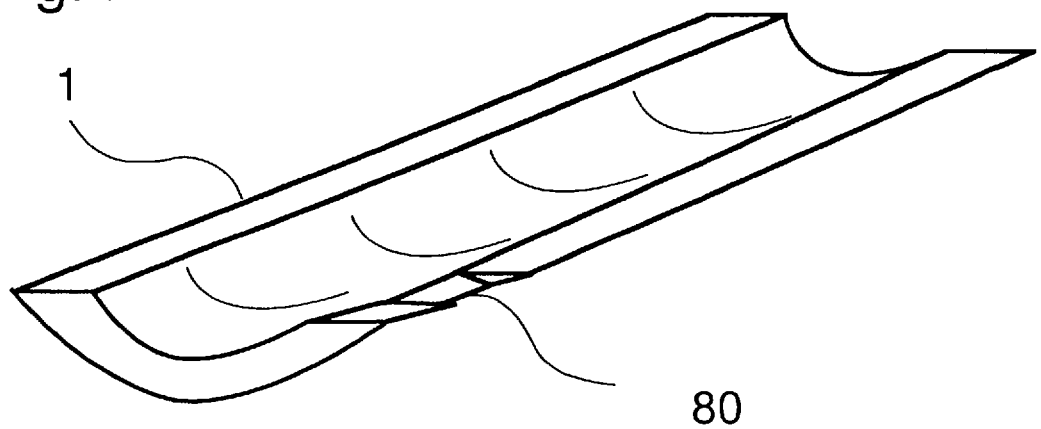
FIG. 4 is an oblique view of one embodiment of a reservoir trough of a processing solution of the present invention.

The present invention will be explained in more detail referring to the accompanying drawings. FIG. 1 is a schematic sectional view of one example of the automatic developing apparatus of the present invention. FIG. 2 is a schematic sectional view of an essential part of the developing portion (and the stabilizing portion) of the apparatus shown in FIG. 1. FIG. 3 is a schematic sectional view of an essential part of the developing portion (and the stabilizing portion) of another example of apparatus. FIG. 4 is an oblique view of a reservoir trough of a processing solution having an overflow groove. The automatic developing apparatus of FIG. 1 comprises roughly a heating part of photosensitive material, a developing part, a stabilizing (neutralizing) part and a drying part. FIG. 2a shows the state where the top end of the photosensitive material 60 delivered runs against the roller as a guiding means for the photosensitive material. FIG. 2b shows the state of the photosensitive material being developed, namely, the state where the photosensitive material takes up the developer and at the same time a reservoir 40 of the developer is formed between the photosensitive material guide roller 2 and the reservoir forming means 3 and thus, the developer is coated on the photosensitive surface.

The developing part consists mainly of a pair of carrying rollers 11 for the photosensitive material, a reservoir trough 1 for the developer, a reservoir forming means 3, a guide roller 2 for the photosensitive material, a reaction maintaining guide 8 which also serves as a delivery guide, a developer circulating pump 12, an intermediate tank 13 for the developer, a developer recovery pan 14 and a developer supplying means 15.

The stabilizing part containing an acid has the similar construction to the developing part and consists mainly of a pair of carrying rollers 21 for the photosensitive material, a reservoir trough 5 for the stabilizing solution, a guide roller 6 for the photosensitive material, a reservoir forming means 7, a reaction maintaining guide 9 which also serves as a delivery guide, a stabilizing solution circulating pump 22, an intermediate tank 23 for the stabilizing solution, a stabilizing solution recovery pan 24 and a stabilizing solution supplying means 25. The carrying rollers 21 also serve as squeeze rollers for removing an excess developer deposited on the photosensitive material. The stabilized photosensitive material is delivered to drying part 10 where it is dried.

The top end of the photosensitive material 60 adjusted to a given temperature by the heating means 31 and horizontally carried by a pair of the carrying rollers 30 runs against the roller 2 as a photosensitive material guiding means (FIG. 2a) and the photosensitive material is led into the developer and it passes through the developer (near the surface of the developer, namely, just below the surface) stored in the reservoir trough 1 and is carried out of the developer with taking up the developer (FIG. 2b).

The photosensitive material guide roller 2 is dipped in the developer at about 1–3 mm from the surface of the developer the level of which is controlled. In this specification, that the photosensitive material is allowed to pass near the surface of the developer stored in the reservoir trough 1 means that the photosensitive material passes through the developer along the photosensitive material guide roller 2 which is dipped in the developer at a depth of about 1–3 mm. The guide roller 2 may not be a roller and may be in the optional forms such as a semicircle as far as it can guide the photosensitive material in the bended form into the developer.

The developer reservoir trough 1 is such that the width of the developer is about 1–3 cm in the carrying direction of the photosensitive material, the depth of the developer is such as being able to pass the photosensitive material therethrough, namely, about 2–20 mm in general, though it depends on the depth of dipping of the guide roller 2, and the width in the direction perpendicular to the carrying direction of the photosensitive material is larger than the width of the photosensitive material. A volume of about 10–100 ml is enough as the volume of the developer stored in the reservoir trough 1.

The level of the developer must be controlled during the development of the photosensitive material (FIG. 2b) since the developer is consumed to make it impossible to carry out the development. The level can be controlled, for example, by supplying the developer 10 to the reservoir trough 1 from the developer intermediate tank 13 by the developer circulating pump 12 to allow the developer to overflow the reservoir trough 1.

The developer taken up and taken out by the photosensitive material 60 forms a reservoir by the reservoir forming means 3 provided at the outlet of the developer trough 1 and in the vicinity of the photosensitive material guide roller 2 together with the photosensitive material guide roller 2 and is metered at a coating amount necessary for effecting a developing reaction. The excess developer again flows into the reservoir trough 1 and reused with being circulated between the reservoir trough 1 and the intermediate developer tank 13. The reservoir forming means 3 is preferably provided at the position near the photosensitive material guide roller 2.

It is preferred that a suitable amount of the developer is deposited on the photosensitive surface of the photosensitive material which has left the reservoir forming means 3. The reservoir forming means 3 also serves to attain this purpose. As such means, there may be used so-called wire bar comprising a roller on which a thin wire is wound (which is also called a doctor bar and the coating amount varies depending on the diameter of the wire), a blade which can keep a certain distance from the surface of the photosensitive material, a usual roller and the like. When a usual roller is employed, the application amount of the developer can be adjusted by adjusting the pressing state of the roller against the photosensitive material.

The application amount of the developer can be such that can maintain the developing reaction and is 10–100 ml/m$^2$, preferably about 20–50 ml/m$^2$ for lithographic printing plates using DTR. The photosensitive material which has left the reservoir forming means 3 is carried to the squeeze rollers 21 through the reaction maintaining guide 8. In order to allow the photosensitive material to be stably developed, the reaction maintaining guide 8 is provided so that the photosensitive material requires a long time to reach the squeeze rollers 21 and the time required for the photosensitive material passing through the reaction maintaining guide 8 is preferably at least 5 seconds and the upper limit is about 12 seconds.

The squeeze rollers 21 squeeze out unnecessary developer as a waste liquor. The developer squeezed out is sent to waste liquor tank 50. The photosensitive material developed in the developing part is stabilized through the stabilizing part which has the construction similar to that of the developing part and is carried to the dryer 10.

Furthermore, a preferred embodiment of the present invention will be explained. The reservoir trough 1 for processing solution is preferably a temporary reservoir trough which stores the processing solution substantially only at the time of processing. The processing solution reservoir trough in the processing apparatus of the present invention is an extremely small trough as mentioned above, and differing from the conventional processing tank of dip processing type, a small and constant amount of the processing solution is stored substantially only at the time of the photosensitive material being processed and the solution is immediately discharged after completion of the processing and recovered by the intermediate tank 13. As a result, deterioration of the processing solution due to the processing of long term, especially air oxidation due to contact with air can be greatly reduced.

Specifically, as shown in FIGS. 3a–3d, the processing solution in an amount more than that discharged from the processing solution discharging hole 70 is supplied at above the temporary reservoir trough from the intermediate tank 13 through the circulating pump 12 and the processing solution supplying means 15 and the supplied solution in excess of the amount of the discharged solution overflows the temporary reservoir trough and thus, a constant amount of the processing solution is stored in the temporary reservoir trough 1. The processing solution discharged from the discharge hole 70 and the processing solution overflowing the temporary reservoir trough are recovered in the intermediate tank 13 through the solution recovering pan 14. After completion of the processing, the circulating pump 12 is stopped and the processing solution in the temporary reservoir trough 1 is discharged from the discharge hole 70 and recovered in the intermediate tank 13 through the processing solution recovering pan 14.

The intermediate tank 13 of the processing solution slightly opens substantially only at the portion at which it connects to the recovery pan 14, namely, is substantially a semi-closed tank and deterioration of the processing solution due to air oxidation caused by contacting with air can be considerably inhibited. Capacity of the intermediate tank 13 varies depending on the kind of the processing solution, but is at least 10 times, preferably at least 20 times that of the temporary reservoir trough 1. Furthermore, in order to keep the amount of the processing solution in the intermediate tank 13 always at constant, a replenishment tank (not shown) can be provided to supply the processing solution to the intermediate tank 13.

Another preferred embodiment of the reservoir trough for the processing solution is that the processing solution is in the overflowing state at least at the time of processing. More preferably, the processing solution which overflows the reservoir trough is recovered and circulated and is again supplied to the reservoir trough. Specifically, as aforementioned, it is circulated through the reservoir trough, the recovery pan, the intermediate tank and the circulating pump. In this case, as mentioned above, a processing solution which has not yet been used can be supplied to the intermediate tank from the replenishing tank and mixed with the overflowing recovered processing solution.

The processing solution reservoir troughs 1, 5 may be provided with an overflow groove 80 cut at the edge.

According to the above-mentioned preferable processing method of the present invention, the photosensitive material is dipped in the processing solution for only a very short period. Therefore, the processing solution is hardly exhausted. The exhaustion degree is less than 1% judging from the change in pH value. Therefore, it has been confirmed that the exhaustion of the processing solution can be ignored by keeping the processing solution reservoir trough at overflowing state. That is, at the time of processing, he reservoir trough is kept at overflowing state and he overflowing solution is recovered and again circulated to the reservoir trough, whereby contents of various components in the processing solution reach equilibrium state and the solution no longer exhausts. The overflowing amount of the processing solution is at least 30 ml/min, preferably at least 60 ml/min at the time of processing of the photosensitive materials.

As mentioned above, when the photosensitive material is processed with keeping the very small reservoir trough of processing solution at overflowing state and the overflowing solution is recirculated, the processing solution reaches equilibrium state and does not exhaust. This has been attained for the first time by the present invention.

The means for supplying the processing solution to the reservoir trough and the position of supplying the solution are not limited. As the supply means, there may be employed, for example, a method of supplying the processing solution from one or a plurality of nozzles, a method of supplying the processing solution by showering system through a cylindrical pipe having a plurality of holes, or a method of supplying the processing solution by spreading in the width direction through a spreading plate the processing solution discharged from the supplying nozzles or pipes.

The position of supplying the processing solution to the processing solution reservoir trough is preferably between the photosensitive material guiding means 2 and the reservoir forming means 3. As mentioned above, in the present invention, the processing solution is coated on the photosensitive material by forming the reservoir 40 of the processing solution by the photosensitive material guiding means 2, the reservoir forming means 3 and the photosensitive material. It is preferred to keep the reservoir 40 at larger than a certain size and it is preferred to supply the processing solution to the reservoir 40 at the position between the photosensitive material guiding means 2 and the reservoir forming means 3.

The above-mentioned photosensitive guiding means 2 may have optional shapes such as roller and semicircle as far as they can guide the photosensitive material into the developer in the bended state. Preferred is a roller. The material of the means 2 is unlimited and there may be used optional materials such as stainless steel and rubber.

As aforementioned, in the present invention, the reservoir 40 is preferably kept at larger than a certain size and important factors therefor are shape and size of the photosensitive material guiding means 2 and the reservoir forming means 3. Therefore, the photosensitive material guiding means 2 and the reservoir forming means 3 are preferably rollers and the diameter thereof is 5 mm or more, preferably 7 mm or ore, especially preferably 9 mm or more and the upper limit is not restricted, but is preferably about 25 mm. The diameters of the two rollers may be the same or different, but preferably they are the same or the diameter of the reservoir forming roller 3 is slightly smaller. The two rollers may be fixed or rotatable. The above two rollers are arranged close to each other in parallel in the width direction of the photosensitive material (perpendicular to the carrying direction). The distance between the two rollers is an important factor to form the reservoir and is at most 5 mm, preferably 1 mm or less, most preferably 0.5 mm or less though it varies depending on the size of the rollers and the viscosity and surface tension of the processing solution. The distance between the two rollers here means a distance between the two rollers when they are at the closest position. The above-mentioned wire bar used as the reservoir forming means is included in the rollers in the present invention.

As described above, the preferable embodiment is that the photosensitive material guiding roller 2 and the reservoir forming roller 3 have both the roles to form the reservoir 40 on the photosensitive surface and to supply the processing solution to the reservoir 40. That is, the processing solution is supplied through the space between the two rollers provided close to each other, and in order to uniformly spread the processing solution of a small amount in the width direction of the photosensitive material, the distance between the two rollers is preferably 1 mm or less, especially preferably 0.5 mm or less as mentioned above. The supplied processing solution is once retained in a cavity 41 formed by the two rollers positioned close to each other and is supplied to the reservoir 40 through the space between the rollers with spreading in width direction. Thus, the reservoir 40 formed on the photosensitive surface is always uniformly held in width direction of the photosensitive material and an image uniform also in width direction can be formed.

The heating means 30 for the photosensitive material may heat the photosensitive material either in contact with the back side of the photosensitive material or without contacting therewith. If necessary, the front side or both sides may be heated. For example, there may be used a plate heater, a panel heater, a grid heater, a heat roller, an infrared heater, a high-frequency heater, a magnetic induction heater, a ceramic heater and the like.

There may be provided a means to control the temperature of the processing solution to a given temperature. For example, a heater (not shown) may be provided in the intermediate tank 13 or in a circulation path of the processing solution.

In the processing method and the processing apparatus of the present invention, the waste solution is only the processing solution which is applied to the photosensitive surface when the photosensitive material passes through the reservoir forming means 3 and which is squeezed off by a pair of the carrying rollers 21 and therefore, the amount of the waste processing solution is greatly diminished as compared with the conventional method and apparatus.

According to the present invention, the photosensitive material is once dipped in the processing solution and takes up the processing solution to form a reservoir on the photosensitive surface. Accordingly, a stable reservoir can be formed irrespective of the viscosity of the processing solution or processing speed and a stable processing can be performed.

As aforementioned, according to the present invention, by realization of the very short-time dipping, not only the processing time can be sharply shortened, but also generation of silver sludge and deterioration of the processing solution hardly occur after continuation of the processing and a maintenance-free processing apparatus can be obtained.

The processing method and the processing apparatus of the present invention are intended for processing of photosensitive materials and are suitable especially for processing of lithographic printing plates utilizing the DTR process. Next, a preferable embodiment of the processing solution for lithographic printing plates used in the present invention will be explained.

A preferred developer contains at least one alkanolamine represented by the following formula (1) and at least one diamine compound represented by the following formula (2) in combination:

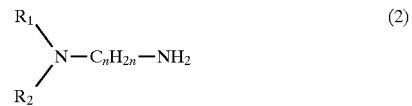 (1)

wherein 1 represents an integer of 1–8, m represents an integer of 0–8, n represents an integer of 1–8, and X represents a hydrogen atom or a hydroxyl group,

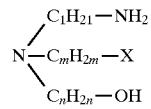 (2)

wherein $R_1$ and $R_2$ each represent a hydrogen atom or an alkyl group of 1–6 carbon atoms (exclusive of $R_1=R_2=H$), and n represents an integer of 2–8.

The alkanolamine represented by the formula (1) is a silver halide solvent high in diffusion transfer speed and has a structure containing one primary amino group and one or two hydroxyl groups. The nonlimiting typical examples of the alkanolamine are shown below.

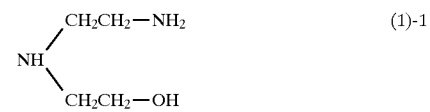 (1)-1

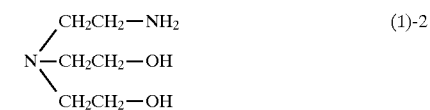 (1)-2

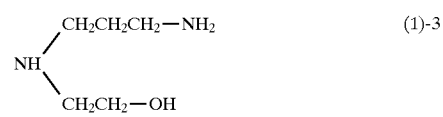 (1)-3

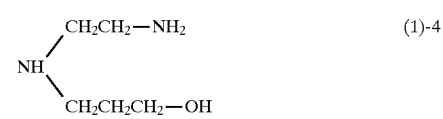 (1)-4

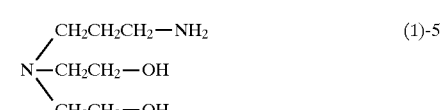 (1)-5

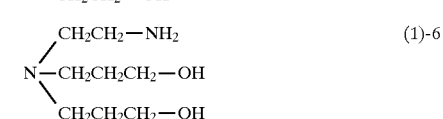 (1)-6

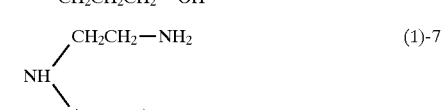 (1)-7

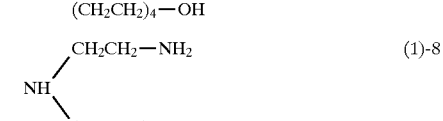 (1)-8

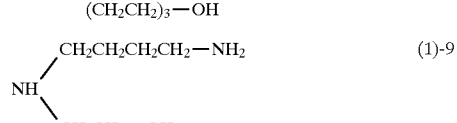 (1)-9

-continued

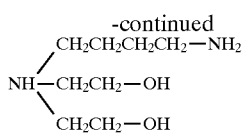
(1)-10

The diamine represented by the formula (2) is a silver halide solvent relatively low in diffusion transfer speed and has a structure containing a primary amino group. The nonlimiting examples of the diamine are shown below.

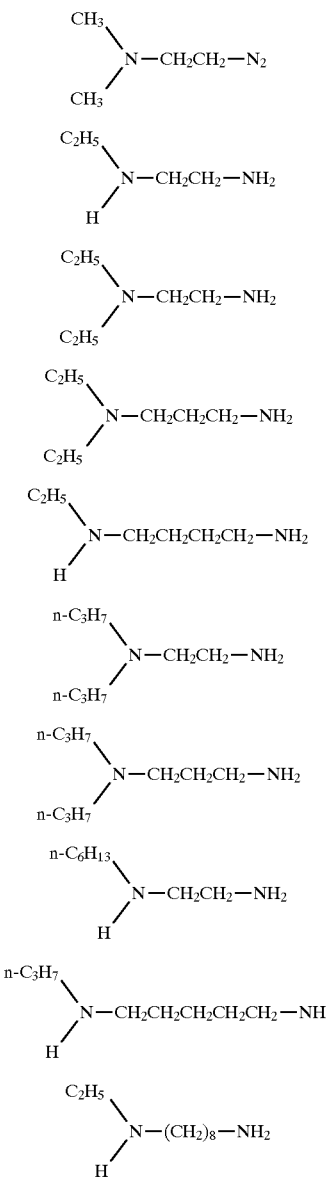

(2)-1
(2)-2
(2)-3
(2)-4
(2)-5
(2)-6
(2)-7
(2)-8
(2)-9
(2)-10

Regarding the amounts of the alkanolamine and the diamine added to the developer, that of the former is 0.05–0.25 mol/l, preferably 0.1–0.15 mol/l and that of the latter is $\frac{1}{20}$–$\frac{1}{2}$, preferably $\frac{1}{12}$–$\frac{1}{5}$ of the unit weight of the alkanolamine.

The processing method of the present invention which carries out the development in a very short time with a small amount of the developer tends to be short of the absolute amount of silver halide solvent and of the time which are necessary for diffusion transfer processing, and particularly, the formation of image silver on the surface is not delayed, but the formation of precipitated silver which forms the base of the image silver and which is later in timing of diffusion transfer processing tends to delay. Accordingly, an image silver can be more stably formed by using the developer containing in combination the silver halide solvent high in diffusion transfer speed and the silver halide solvent low in diffusion transfer speed.

Moreover, the processing method of the present invention aims at a rapid processing with a small amount of the processing solution, and when the processing is carried out with an extremely small amount of the processing solution, the processing temperature depends mainly on the temperature of lithographic printing plates. Accordingly, though a preferred embodiment of the processing apparatus of the present invention is to provide a heating means 31 for lithographic printing plates before subjecting to development, the developer is further improved in order to be able to cope with the change in the processing temperature. The two embodiments are shown below.

One is to add at least one benzotriazole derivative compound represented by the following formula (3) to the developer.

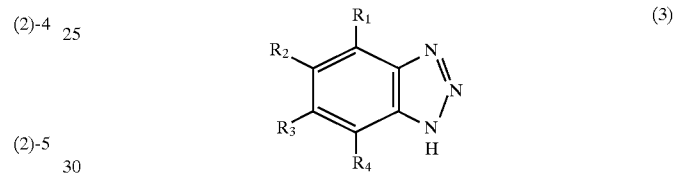
(3)

wherein $R_1$–$R_4$ each represent a hydrogen atom, an alkyl group of 5 or less carbon atoms, an amino group, a hydroxyl group, a carboxyl group, a sulfonic acid group, an alkoxycarbonyl group of 13 or less carbon atoms, an acylamide group of 10 or less carbon atoms or a sulfonamide group. The above compounds are commercially easily available as chemicals and chemical products. The nonlimiting examples of the compounds are shown below.

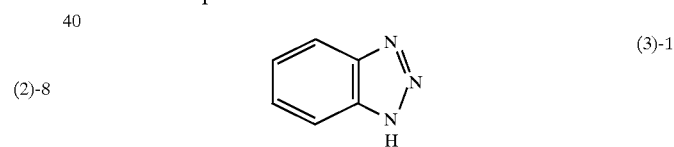
(3)-1

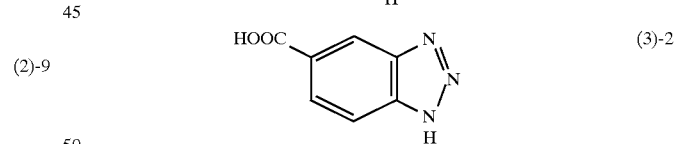
(3)-2

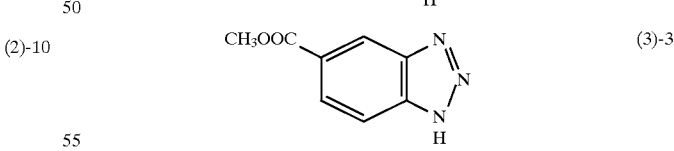
(3)-3

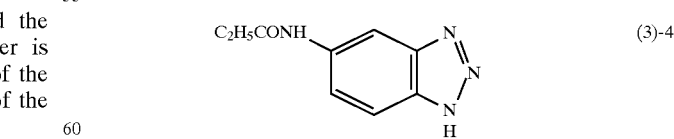
(3)-4

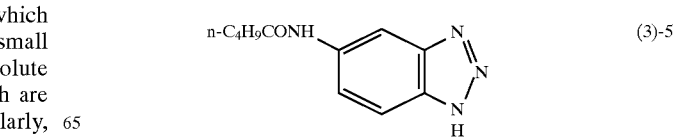
(3)-5

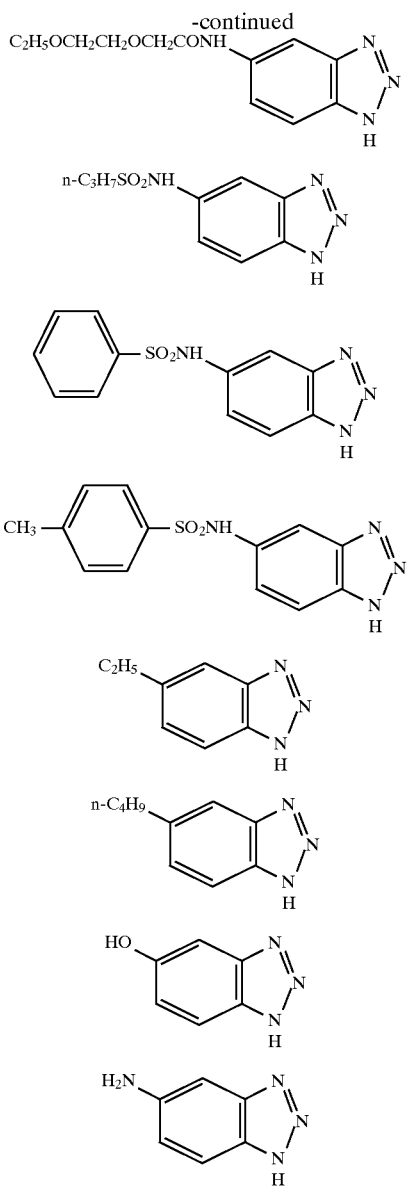

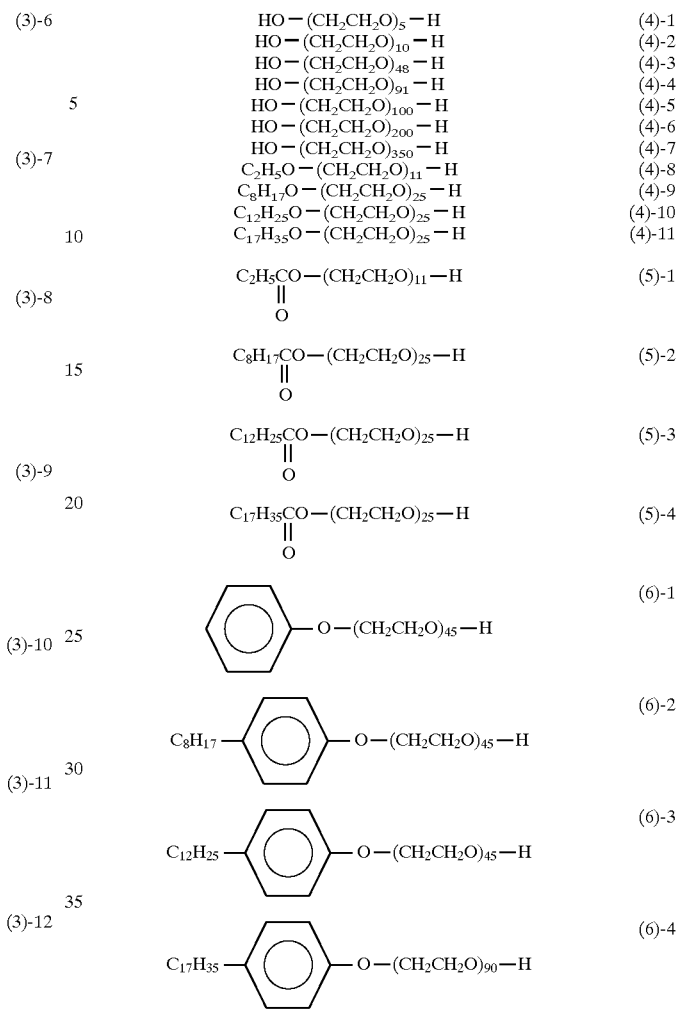

Amount of the compound contained in the developer is 0.01–5.0 g/l, preferably 0.05–0.5 g/l. Another is to add at least one of the polyoxyethylene compounds represented by the following formulas (4), (5) and (6) to the developer.

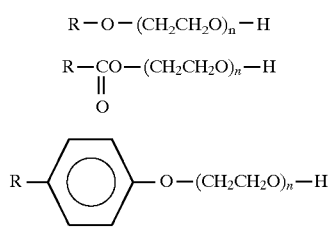

wherein n is 4–500 and R represents a hydrogen atom or an alkyl group of 1–20 carbon atoms.

The polyoxyethylene compounds represented by the above formulas (4), (5) and (6) have an oxyethylene chain length of n=4–500, preferably 20–200 and R in the formulas is a hydrogen atom or an alkyl group of 1–20 carbon atoms. These compounds are commercially easily available as chemicals and chamical products. The nonlimiting examples of the compounds are shown below.

Amount of the above compound contained in the developer is 0.5–80 g/l, preferably 1–30 g/l.

The developer used in the present invention can contain in addition to the above compounds an alkaline substance such as sodium hydroxide, potassium hydroxide, lithium hydroxide or sodium tertiary phosphate, a preservative such as a sulfite, a silver complexing agent such as a thiosulfate, a thiocyanate, a cyclic imide or thiosalicylic acid, a tackifier such as hydroxymethyl cellulose or carboxymethyl cellulose, an antifoggant such as potassium bromide, 1-phenyl-5-mercaptotetrazole or a compound described in Japanese Patent Kokai (Laid-Open) No. 47-26201, a developing agent such as hydroquinone or 1-phenyl-3-pyrazolidone, and others.

Preferred developers used in the processing method of the present invention are mentioned above, but more preferred is to use so-called alkaline activator solutions containing substantially no developing agent. Lithographic printing plates to be subjected to alkaline activation processing and alkaline activator solutions used for the processing are disclosed, for example, in British Patent Nos. 1,000,115, 1,012,476, 1,017,273 and 1,042,477, and Japanese Patent Kokai (Laid-Open) Nos. 56-27151, 57-86835, 58-196548 and 62-239160. The lithographic printing plates to be subjected to alkaline activation processing are lithographic printing plates which contain a developing agent necessary for DTR development in a photosensitive element and which are to be processed with an alkaline activator containing substantially no developing agent.

The alkaline activator solution has the advantage that exhaustion by air oxidation is very small, but in the case of the conventional processing methods and processing solutions, the processing solution is deteriorated by continuation of the processing even when the alkaline activator solution is used. That is, for obtaining performances stable against printing and staining, the lithographic printing plate must be dipped in the processing solution for some period of time and as a result, the developing agent, especially hydroquinone, contained in the constituting element of the lithographic printing plate dissolves into the processing solution, resulting in decrease of pH of the processing solution. Especially, in the case of the alkaline activator solution, the decrease of pH is a serious problem.

Accordingly, the processing method of the present invention in which the dipping time in the processing solution is extremely short can exhibit the advantage of the alkaline activator solution at its maximum in the aspect of running stability of the processing solution.

As DTR lithographic printing plates, there are generally known those which comprise a support and, provided thereon in succession, an undercoat layer serving also as an antihalation layer, a silver halide emulsion layer and a physical development nuclei layer as photosensitive elements. In the case of the above-mentioned lithographic printing plates subjected to alkaline activation processing, the developing agent may be contained in any of the photosensitive element layers and may be contained in two or more layers.

The developing agents are unlimited, but preferred are hydroxybenzene developing agents such as hydroquinone, catechol and methylhydroquinone and 3-pyrazolidone developing agents such as 1-phenyl-3-pyrazolidone, 1-phenyl-4,4-dimethyl-3-pyrazolidone and 1-phenyl-4-methyl-4-hydroxymethyl-3-pyrazolidone. Content of the developing agent is about 0.5–3 g per 1 $m^2$ of the lithographic printing plate, and preferably, hydroquinone in an amount of 0.5–2 g per 1 $m^2$ and a 3-pyrazolidone developing agent in an amount of $\frac{1}{20}$–$\frac{1}{2}$ of the weight of hydroquinone are contained.

The alkaline activator solution can contain the substances used in the above-mentioned developer such as alkaline substance, preservative, silver complexing agent, antifoggant and tackifier except that substantially no developing agent is contained. The pH value of the activator solution is not critical, but is preferably 12 or higher.

A preferred embodiment of stabilizing solution (neutralizing solution) used for the processing method of the present invention will be explained. It is a stabilizing solution used for lithographic printing plates which contains at least one nitrogen-containing heterocyclic compound having a mercapto group or a thione group. More preferably, the stabilizing solution has a pH of 4.5–6.5 and contains a buffer component at a concentration of 0.1–0.4 mol/l. At least one of the buffer components is an amino acid.

The stabilizing solution used for DTR lithographic printing plates is a processing solution which is fed to the surface of the printing plate to stop the developing activity of the developer component remaining in the lithographic printing plate after subjected to the development and which provides a pH value of the surface in such a range as giving no adverse effect on storage stability and printability.

If the pH value of the surface of the lithographic printing plate after subjected to processing is lower than 6, stain with ink occurs at the beginning of printing and if it is higher than 9.5, ink-receptivity of the surface is inferior and the image silver discolors during storing. These problems can be solved by adjusting the plate surface after processing to a pH of 6–9.5.

The concentration of buffer component is a molar concentration of the buffer component added to the stabilizing solution used for neutralizing the surface of lithographic printing plate after subjected to development. The buffer neutralizes the alkali agent in the developer remaining on the surface and adjusts the processed surface to have a pH in the above range.

Since the processing method of the present invention is carried out in a short time with a small amount of the processing solution, the concentration of buffer component in the stabilizing solution must be higher than that in the conventional dip processing method and the pH value of the stabilizing solution usually shifts to the acidic side.

Under such conditions, it is difficult to stably solubilize nitrogen-containing heterocyclic compounds having a mercapto or thione group which improve ink-receptivity.

By the present invention, there can be prepared, for the first time, a stabilizing solution for the surface of lithographic printing plates which can stably solubilize the nitrogen-containing heterocyclic compounds and has a buffering ability to neutralize the surface of lithographic printing plates.

That is, the stabilizing solution is prepared so that the concentration of the buffer component is in the range of 0.1–0.4 mol/l, an amino acid compound is used as at least one buffer component and pH of the stabilizing solution per se is in the range of 4.5–6.5.

If the concentration of buffer component is less than 0.1 mol/l, the developer remaining on the plate surface cannot be sufficiently neutralized and as a result, the surface has a high pH to cause decrease of ink-receptivity and deterioration of the plate. If it is more than 0.4 mol/l, it is difficult to stably solubilize the nitrogen-containing heterocyclic compounds having a mercapto or thione group and furthermore, much components deposit on the surface and the ink-receptivity is rather deteriorated.

If pH of the stabilizing solution is lower than 4.5, it is difficult to solubilize the nitrogen-containing heterocyclic compounds having a mercapto or thione group used for improvement of ink-receptivity and if it is higher than 6.5, pH of the plate surface cannot be sufficiently lowered.

The amino acids used in the present invention may be either natural or synthetic products and may be any of aliphatic amino acids, acidic amino acids, basic amino acids, aromatic amino acids, heterocyclic amino acids and the like. The carboxyl group in the molecule may be in the form of potassium salt or sodium salt.

Typical examples of the amino acids are glycine, alanine, valine, serine, glutamic acid, glutamine, arginine, cysteine, phenylalanine and histidine.

The buffers used in the present invention include inorganic acids such as phosphoric acid, sulfuric acid, nitric acid, nitrous acid, boric acid and silicic acid, and salts thereof, organic acids such as acetic acid, propionic acid, citric acid, succinic acid and tartaric acid, and salts thereof, and polymeric acids such as alginic acid, polyvinylacetic acid and polyacrylic acid. These may be used each alone or in combination of two or more.

The nitrogen-containing heterocyclic compounds having a mercapto or thione group used in the present invention are those which are described in Japanese Patent Kokai (Laid-Open) Nos. 47-26201, 58-127928 and 2-259643. The following are nonlimiting examples of these compounds: 2-phenyl-5-mercaptooxadiazole, 4-benzamide-3-mercapto-5-pentyl-3-1,2,4-triazole, 3-propylbenzothiazoline-2,4-thione, 5-propyl-2-mercapto-1,3,4-oxadiazole, 5-heptyl-2-mercapto-1,3,4-oxadiazole, 3-methylbenzothiazoline-2- thione, 3-propylbenzothiazoline-2-thione, -5-(p-methylphenyl)-2-mercapto-1,3,4-oxadiazole, 1-phenyl-5-mercapto-1,2,3,4-tetrazole, 4-acetamide-3-methyl-5-mercapto-1,2,4-triazole and 1,3-diethyl-benzimidazoline-2-thione.

The stabilizing solution of the present invention can contain conventionally known substances such as tackifier, preservative, etch agent, wetting agent, rust preventive and surface active agent, thereby to modify the processing activity. Examples of these substances are gum arabic, carboxymethyl cellulose, sodium alginate, polyvinyl alcohol, gelatin, EDTA, acetylacetone, colloidal silica, colloidal alumina, glycerin, polyethylene glycol, polyethylene glycol alkyl ether, acetylene glycol ethylene oxide adduct, fatty acid esters with polyhydric alcohols such as sorbitan monooleic acid ester and alkylamine salts.

The present invention will be explained by the following nonlimiting examples using DTR lithographic printing plates.

EXAMPLE 1

An automatic developing apparatus as shown in FIG. 1 and FIG. 2 was manufactured. The developer reservoir trough 1 and the stabilizing solution reservoir trough 5 each had a width of 20 mm (in carrying direction of the lithographic printing plate), a length of 450 mm (in the direction perpendicular to the carrying direction) and a depth of 5 mm. The photosensitive material guide rollers 2 and 6 made of stainless steel and having a diameter of 12 mm were provided so that they were dipped in a depth of 2 mm in the processing solution. The carrying speed of the lithographic printing plate was 30 mm/sec. Wire bars of 10.8 mm in diameter (0.3 mm in diameter of wire) were used as the reservoir forming means 3 and 7. The lithographic printing plate was a DTR printing plate of 254 mm in width and 400 mm in length which consisted of a support comprising a paper coated with a polyethylene resin on both sides (RC paper) and an antihalation layer, a silver halide emulsion layer and a physical development nuclei layer provided on the support in succession, and thirty plates were processed. Temperature of the DTR developer and the stabilizing solution was 30° C. After processing, only a little silver sludge was produced in the developer reservoir trough. When this DTR printing plate was developed with the same DTR developer at 30° C. for 1 second, amount of the silver halide which was transfer (physical) developed was 41% by weight of the amount of undeveloped silver halide.

The 1st printing plate and the 30th printing plate made by the above procedure were mounted on an offset printing machine and applied with an etch solution all over the plate surface, and printing was run using a fountain solution.

The printing machine employed was A. B. Dick 350 CD (Trademark of an offset printing machine supplied y A. B. Dick Co.). There were no significant differences between the 1st lithographic printing plate and the 30th lithographic printing plate with occurrence of neither drifting of images nor drag patterns, and the whole plate could be extremely uniformly developed from the top end portion of the plate and the plate had a sufficiently high printing endurance.

Separately, thirty DTR printing plates mentioned above were similarly processed using a commercially available automatic process camera having a developing trough and a stabilizing trough (neutralizing trough). After the processing, a considerably large amount of silver sludge was produced in the developing trough. Amount of the silver halide which was transfer developed (physical development) when the DTR printing plates left the developing trough was 84% by weight of the undeveloped silver halide. The thus obtained 1st and 30th lithographic printing plates were mounted on the offset printing machine and printing was carried out in the same manner as above. The 30th plate showed drifting of images and formation of drag pattern, and in addition, was inferior to the 1st plate in printing endurance.

EXAMPLE 2

An automatic developing apparatus as shown in FIG. 1 and FIG. 3 was manufactured. The temporary developer reservoir trough 1 and the temporary stabilizing solution reservoir trough 5 each had a width of 20 mm (in carrying direction of the lithographic printing plate), a length of 450 mm (in the direction perpendicular to the carrying direction) and a depth of 5 mm. The capacity of the temporary processing solution reservoir troughs 1 and 5 was both about 15 ml. 1.5 liter of the developer and 1.5 liter of the stabilizing solution were charged in the intermediate tanks 13 and 23, respectively. The forced supply of the processing solution to the intermediate tank was not effected. The photosensitive material guide rollers 2 and 6 made of stainless steel and having a diameter of 12 mm were provided so that they were dipped in a depth of 2 mm in the processing solution. The carrying speed of the lithographic printing plate was 30 mm/sec. Rollers made of stainless steel and having a diameter of 11 mm were used as the reservoir forming means 3 and 7. Amount of the processing solution supplied from the processing solution supply means at the processing was 60 ml/min and the solution discharging rate from the discharging hole 70 was about 20 ml/min. The lithographic printing plate used was the same as used in Example 1 and 200 plates were processed. Temperature of the DTR developer and the stabilizing solution was 30° C.

Separately, as comparative example, 200 plates ere processed by the conventional dip developing method (capacity of the developing trough and that of the stabilizing tank were both 1.5l). Temperature of the DTR developer and the stabilizing solution was 30° C.

The 1st, 50th, 100th, 150th and 200th printing plates obtained were respectively mounted on an offset printing machine and applied with an etch solution all over the surface, and printing was carried out using a fountain solution.

The printing machine employed was A. B. Dick 350 CD (Trademark of an offset printing machine supplied by A. B. Dick Co.). The printing endurance was evaluated by the following grades. The results are shown in Table 1.

The printing endurance was evaluated in terms of the number of prints obtained before the printing became impossible owing to insufficient ink-receptivity of the image portion or disappearance of line image.

Grade 1: More than 10000 prints

Grade 2: More than 7500 prints

Grade 3: More than 5000 prints

Grade 4: Less than 5000 prints

TABLE 1

|  | Printing endurance | |
|---|---|---|
|  | The present invention | Comparative Examples |
| The 1st plate | 1 | 1 |
| The 50th plate | 1 | 2 |
| The 100th plate | 1 | 2 |
| The 150th plate | 1 | 2 |
| The 200th plate | 1 | 4 |

In the case of the lithographic printing plates processed in accordance with the present invention, all of the 1st, 50th, 100th, 150th and 200th plates could be very uniformly developed on the whole surface from the top end portion with occurrence of neither drifting of image nor drag pattern and had a sufficiently high printing endurance. On the other hand, it was found that the lithographic printing plates processed in accordance with the conventional dip developing method gradually decreased in printing endurance with increase of the number of the processing.

EXAMPLE 3

Lithographic printing plates were processed using the same automatic developing machine as in Example 1 which is shown in FIG. 1 and FIG. 2. The lithographic printing plates were SILVER MASTER (SLM-R2 manufactured by Mitsubishi Paper Mills Ltd.), the developer used was SLM-AC (manufactured by Mitsubishi Paper Mills Ltd.), and the stabilizing solution used was SLM-ST (manufactured by Mitsubishi Paper Mills Ltd.). The time required for the dip coating was changed depending on the size of the processing solution reservoir trough and the carrying speed and the time for which the state of the processing solution being applied to the photosensitive surface of the lithographic printing plate was maintained was changed depending on the length of the reaction maintaining guide and the carrying speed. One hundred lithographic printing plates of 254×400 mm were continuously processed. Generation of silver sludge in the processing trough after completion of the processing and image quality of the 100th plates (generation of drag pattern) were examined.

The 1st and 100th printing plates thus obtained were respectively mounted on an offset printing machine A. B. Dick 350 CD (Trademark of an offset printing machine supplied by A. B. Dick Co.) and applied with an etch solution all over the surface, and printing was carried out using a fountain solution. The printing endurance was evaluated by the following grades. The results are shown in Table 2.

The printing endurance was evaluated in terms of the number of prints obtained before the printing became impossible owing to insufficient ink-receptivity of the image portion or disappearance of line image.

Grade 1: More than 10000 prints
Grade 2: More than 8000 prints
Grade 3: More than 6000 prints
Grade 4: Less than 6000 prints

TABLE 2

| Dipping time (sec) | Reaction maintaining time (sec) | Production of sludge | Printing endurance | | Drag pattern on the 100th plate |
|---|---|---|---|---|---|
| | | | The 1st plate | The 100th plate | |
| 1 | 5 | No | 2 | 2 | No |
| 1 | 7 | No | 1 | 1 | No |
| 1.5 | 7 | A little sludge | 1 | 1 | No |

Separately, for comparison, processing was conducted using the conventional dip processing apparatus with a dipping time of 1 second or 1.5 second and maintaining for 7 seconds the state of the processing solution being applied to the photosensitive surface, and printing was carried out using the resulting printing plates in the same manner as above and stain of the prints with ink was examined. As a result, in the case of the printing plates made by the conventional dip processing apparatus, stain with ink occurred immediately after starting of printing, but in the case of the printing plates of the present invention, no stain occurred even after the number of prints reached that shown in Table 2.

EXAMPLE 4

An automatic developing machine shown in FIG. 1, FIG. 2 and FIG. 4 was manufactured. A panel heater of which the surface was made of stainless steel was used as the photosensitive material heating means 31. The surface temperature of the panel heater was 47° C. Other constituents were the same as those of the processing apparatus of Example 1. However, the reservoir forming means 3 was provided at a distance of 0.25 mm from the photosensitive material guide roller 2 and at a distance of 0.2 mm above the edge of the processing solution reservoir trough.

As comparative processing apparatuses, CP-414S (manufactured by Mitsubishi Paper Mills Ltd. and Dainippon Screen Mfg. Co., Ltd.) of conventional dip processing type, a processing apparatus of developer-saving dip processing type described in U.S. Pat. No. 5,307,109 and a processing apparatus of coating type described in Japanese Patent Kokai (Laid-Open) No. 63-137233 were employed.

The same lithographic printing plate as used in Example 1 was used and about 5 m² thereof was processed. SLM-AC and ST (manufactured by Mitsubishi Paper Mills Ltd.) were used as the DTR developer and the stabilizing solution, respectively, and the processing temperature was 30° C. for all of the apparatuses.

The processing was carried out at ambient temperatures of 10° C., 20° C. and 30° C. Printing endurance and amount of the waste solution per unit m² in the processing by the respective apparatuses were measured.

The lithographic printing plate was applied with an etch solution all over the surface and printing fountain solution by RYOBI 3200 CD as a printing machine. The results are shown in Table 3

TABLE 3

| Processing apparatus | Ambient temperature °C. | Printing endurance The number of prints obtained | Amount of waste solution ml/m² |
|---|---|---|---|
| The present invention | 10 | 8000 | 25 |
|  | 20 | 10000 |  |
|  | 30 | 10000 |  |
| CP-414S | 10 | 3000 | * |
|  | 20 | 7000 | 140 |
|  | 30 | 10000 |  |
| Solution-saving dip type | 10 | 1000 | * |
|  | 20 | 4000 | 170 |
|  | 30 | 7000 |  |
| Coating type coating amount 30 ml/m² | 10 | 1000 |  |
|  | 20 | 3000 | 20 |
|  | 30 | 4000 |  |
| Coating type Coating amount 80 ml/m² | 10 | 3000 |  |
|  | 20 | 4000 | 70 |
|  | 30 | 7000 |  |

In Table 3, * for the amount of waste solution is a value calculated from the standard processing ability of SLM-Ac and the capacity of the processing trough.

The processing apparatus of the present invention produced less waste solution than the conventional processing apparatuses and was not affected by the ambient temperature and could make lithographic printing plates having always stable printing endurance.

EXAMPLE 5

An automatic developing apparatus having the same construction as the apparatus used in Example 1 as shown in FIG. 1 and FIG. 2 was used, except that the reservoir forming means 3 and 7 were mirror finished rollers having a diameter of 11 mm and the distance between the photosensitive material guide roller and the reservoir forming means (roller) was 0.25 mm. The amount of the developer supplied through the space between the photosensitive material guide rollers 2 and 6 and the reservoir forming means 3 and 7 was set at 1 ml/sec. The amount of the processing solution stored in the developer reservoir trough 1 and the stabilizing solution reservoir trough 5 was about 15 ml and the amount of the processing solution in the intermediate tanks 13 and 23 was about 1500 ml, and the processing solution was circulated between the developer reservoir trough and the intermediate tank by the supply of the processing solution and the overflow of the processing solution from the reservoir trough. No forced supply of the processing solution to the intermediate tank was effected. The amount of the processing solution to be applied to the photosensitive surface after the lithographic printing plate passed through the reservoir forming means 3 and 7 was set to be about 25 ml/m² and the time for which the lithographic printing plate passes through the reaction maintaining guides 8 and 9 was set at about 7 seconds.

Separately, for comparison, a commercially available automatic process camera having a developing trough and a stabilizing trough (neutralizing trough) therein was used. Amount of the developer stored in the developing trough of this apparatus was 1500 ml and the time for which the lithographic printing plate was dipped in the developer was about 12 seconds.

The lithographic printing plate used was a lithographic printing plate to be processed with an alkaline activator solution which was made by providing on an RC paper an antihalation layer containing carbon black and 0.2 g/m² of 1-phenyl-3-pyrazolidone as a developing agent, coating thereon an orthochromatically sensitized high-sensitivity silver chlorobromide emulsion (silver chloride 90 mol %) at a coating amount of 1 g/m² in terms of silver nitrate, which was dried and then heated at 40° C. for 3 days, and then coating on the emulsion layer a physical development nuclei layer containing 1 g/m² of hydroquinone as a developing agent.

As a DTR developer, an alkaline activator solution having the following composition was used.

| Water | 700 ml |
|---|---|
| Potassium hydroxide | 17 g |
| Sodium hydroxide | 7 g |
| Sodium sulfite | 35 g |
| Ethanolamine | 10 g |
| Water to make up 1 liter in total. | |

The stabilizing solution (neutralizing solution) had the following composition.

| Water | 600 ml |
|---|---|
| Citric acid | 10 g |
| Sodium citrate | 35 g |
| Colloidal silica (20%) | 5 ml |
| Ethylene glycol | 5 ml |
| Water to make up 1 liter in total. | |

The temperature of the DTR developer and the stabilizing solution was 30° C. and 200 lithographic printing plates of 303×480 mm made hereabove were processed by the processing apparatus of the present invention and the conventional processing apparatus, respectively. The 1st, 100th and 200th printing plates made in this way were evaluated on printing endurance in the same manner as in Example 3. Furthermore, pH value of the developer and generation of silver sludge were also examined. The results are shown in Table 4.

TABLE 4

| Processing method | The number of processing | pH of developer | Silver sludge | Printing endurance |
|---|---|---|---|---|
| The present invention | The 1st plate | 13.44 | No | 1 |
|  | The 100th plate | 13.16 | No | 1 |
|  | The 200th plate | 13.19 | No | 1 |
| Comparative Example | The 1st plate | 13.44 | No | 1 |
|  | The 100th plate | 12.88 | Produced | 2 |
|  | The 200th plate | 11.95 | Considerably produced | 4 |

As can be seen from the results of the Example, when lithographic printing plates to be processed with alkaline activator solutions were processed by the processing method of the present invention, no decrease of pH value of the developer occurred even after the processing was continued and printing plates of high printing endurance could be stably obtained. Furthermore, silver sludge was not produced and a rapid and stable processing became possible with use of an extremely small amount of a processing solution. Moreover, the processing apparatus to which the present processing method was applied was superior in maintenance because no silver sludge was produced and besides, amount of the waste solution produced from the apparatus could be considerably reduced. On the other hand, when the conventional dip processing apparatus was used, the pH value of the developer decreased after continuation of the processing and printing endurance of the resulting printing plate considerably deteriorated.

EXAMPLE 6

The same automatic processing apparatus as used in Example 1 as shown in FIG. 1 and FIG. 2 was used. The same lithographic printing plate as used in Example 1 was used. The lithographic printing plate was imagewise exposed by a process camera having an image reversal mechanism and processed with the following developer and stabilizing solution.

| Developer: | |
| --- | --- |
| Potassium hydroxide | 17 g |
| Sodium hydroxide | 6.8 g |
| Potassium sulfite | 44 g |
| Alkanolamine | 10 g |
| Diamine | 2 g |
| Water to make up 1 liter in total. | |

The combination of the above alkanolamine and diamine was changed as shown in Table 5.

| Stabilizing Solution: | |
| --- | --- |
| Potassium Phosphate monobasic | 32 g |
| Phosphoric acid | 2 g |
| Sodium sulfite | 2.5 g |
| EDTA-Na | 1 g |
| Water to make up 1000 ml in total. | |

Printing was carried out by Heidenberg TOK offset printing machine with applying an etch solution to all over the surface of the printing plate and using a fountain solution for DTR lithographic printing plates.

The resulting prints were evaluated in terms of the following grades. The results are shown in Table 5.

Printing endurance:
a: More than 20000 prints
b: More than 10000 prints
c: More than 5000 prints
Ink stain resistance:
a: No stain occurred.
c: Light stain occurred on the whole or a part of the surface.
d: Heavy stain occurred on the whole surface.

TABLE 5

| Alkanol-amine | Diamine | Printing endurance | Ink stain resistance |
| --- | --- | --- | --- |
| (1)-1 | (2)-3 | a | a |
| (1)-3 | (2)-2 | a | a |
| (1)-7 | (2)-6 | a | a |

When the developer contained the alkanolamine and the diamine in combination in the processing method of the present invention, they had advantageous effect on the printing endurance and the ink stain resistance.

EXAMPLE 7

The same automatic processing apparatus as used in Example 1 as shown in FIG. 1 and FIG. 2 was used. The temperature of the developer in the intermediate tank 13 for developer was set at 30° C. and the developer was supplied to the developer reservoir trough 1 by the circulating pump 12 at a rate of 1 ml/sec. The same lithographic printing plate as in Example 1 was used and was imagewise exposed by a process camera having the image reversal mechanism.

The lithographic printing plate was set at given temperatures (20°, 30° and 40° C.) by the heating means 31. The room temperature at the time of development was set at 20° C.

The above apparatus and lithographic printing plate and processing solutions of the following compositions as the developer and the stabilizing solution were used.

| Developer: | |
| --- | --- |
| Potassium hydroxide | 17.50 g |
| Sodium hydroxide | 7.50 g |
| Sodium sulfite | 35.00 g |
| N-aminoethylethanolamine | 20.00 g |
| Benzotriazole compound | 0.30 g |

The compounds (3)-1, (3)-2, (3)-4, (3)-5, (3)-9, (3)-10 and (3)-13 exemplified hereabove were used as the benzotriazole compounds.

| Stabilizer: | |
| --- | --- |
| Phosphoric acid | 1.25 g |
| Potassium phosphate monobasic | 20.00 g |
| Sodium sulfite | 2.50 g |
| EDTA-Na | 6.25 g |
| Water to make up 1 liter in total. | |

The lithographic printing plate made in this way was mounted on an offset printing machine and printing was carried out using the following etch solution and fountain solution.

| Etch solution: | |
| --- | --- |
| Water | 900 ml |
| Isopropyl alcohol | 400 ml |
| Ethylene glycol | 50 g |
| 3-Mercapto-4-acetamide-5-n-heptyl-1, 2, 4-triazole | 1 g |
| Fountain solution: | |
| Water | 900 ml |
| Potassium phosphate monobasic | 12 g |
| Sodium nitrate | 3 g |
| Triethanolamine | 2 g |
| Colloidal silica | 80 g |
| Ethylene glycol | 40 g |

The printing machine employed was A. B. Dick 350 CD (Trademark of offset printing machine supplied by A. B. Dick Co.) and the ink used was an oil base offset ink 3-1012 manufactured by A. B. Dick Co. Printability was evaluated in terms of the number of prints obtained before the printing became impossible owing to the stain of non-image portion or disappearance of image due to wearing off of silver image. Results of the evaluation were shown by the following grades in Table 6.

Printability:

A: More than 20,000 prints

B: 15,000–20,000 prints

C: 10,000–15,000 prints

D: 5,000–10,000 prints

E: Less than 5,000 prints

TABLE 6

| Compound | Printability Temperature of lithographic printing plate | | | Note |
|---|---|---|---|---|
| | 20° C. | 30° C. | 40° C. | |
| (3)- 1 | B | B | A | The present invention |
| (3)- 2 | A | A | A | " |
| (3)- 4 | B | A | A | " |
| (3)- 5 | B | B | B | " |
| (3)- 7 | B | B | B | " |
| (3)-10 | B | B | B | " |
| (3)-13 | A | A | A | " |

When the developer contains the above benzotriazole derivatives, the temperature range for proper development broadens and this is extremely effective in the processing method of the present invention in which the developing temperature depends on the temperature of the lithographic printing plate and good printability can be obtained regardless of the change in developing temperature due to the change in temperature of the lithographic printing plate.

EXAMPLE 8

The same automatic processing apparatus as used in Example 1 as shown in FIG. 1 and FIG. 2 was used. The same lithographic printing plate as in Example 1 was used and was imagewise exposed by a process camera having the image reversal mechanism and processed with the following developer and the same stabilizing solution as used in Example 6.

| Developer: | |
|---|---|
| Water | 700 g |
| Potassium hydroxide | 17 g |
| Sodium hydroxide | 7 g |
| 2-(2-Aminoethylamino) ethanol | 10 g |
| Sodium sulfite | 35 g |
| Polyoxyethylene compound | 20 g |
| Water to make up 1000 ml in total. | |

The exemplified compounds (4)-3, (4)-4, (4)-8 and (6)-1 were used as the above polyoxyethylene compound.

Then, the lithographic printing plate was dried and mounted on Heiderberg TOK offset printing machine. The printing plate was applied with the same etch solution as used in Example 7 all over the surface, and printing was carried out using the same fountain solution as used in Example 7. The printing ink used was F gloss Kon'ai (manufactured by Dai Nippon Ink & Chemical Inc.) the use of which most readily causes the ink stain in evaluation of stain resistance.

The result prints were evaluated by the same criteria as in Example 6. The results are shown in TABLE 7.

TABLE 7

| Polyoxyethylene Compound | Developing temperature (°C.) | Printing endurance | Stain resistance |
|---|---|---|---|
| (4)-3 | 20 | a | a |
| | 30 | a | a |
| | 40 | a | a |
| (4)-4 | 20 | b | a |
| | 30 | a | a |
| | 40 | a | a |
| (4)-8 | 20 | a | a |
| | 30 | a | a |
| | 40 | a | a |
| (6)-1 | 20 | a | a |
| | 30 | a | a |
| | 40 | a | a |

The above developing temperature was set so that it was the same as the temperature of the lithographic printing plate and that of the developer.

When the developer contains the above polyoxyethylene compounds in the processing method of the present invention, printing endurance and ink stain resistance are improved and the temperature range for proper development broadens to the lower temperature side and this is extremely effective in the processing method of the present invention in which the developing temperature depends on the temperature of the lithographic printing plate.

Example 9

The same automatic processing apparatus as used in Example 1 as shown in FIG. 1 and FIG. 2 was used. The same lithographic printing plate as in Example 1 was used and was imagewise exposed by a process camera having the image reversal mechanism and processed with the following developer and stabilizing solution.

| Developer: | |
|---|---|
| Potassium hydroxide | 17.5 g |
| Sodium hydroxide | 7.5 g |
| Potassium sulfite | 44.0 g |
| 2-Aminoethylethanolamine | 10 g |
| Polyoxyethylene glycol | 20 g |
| Water to make up 1000 ml in total. | |

The stabilizing solution had the following composition, the detail of which is shown in Table 8.

TABLE 8

| 2-Mercapto-5-heptyl-1,3,5-oxadiazole | a g |
|---|---|
| Triethanolamine | 10 g |
| Glycine | x g |
| Potassium phosphate monobasic | y g |
| Phosphoric acid | z g |
| Water to make up 1000 ml in total. | |

| Stabilizing solution | a | x | y | z | Molar concentration mol/l | pH of solution |
|---|---|---|---|---|---|---|
| 1 | 0.1 | 3 | 36 | 2 | 0.32 | 6 |
| 2 | 0.1 | 2 | 7 | 3 | 0.10 | 6 |
| 3 | 0.1 | 20 | 50 | 2 | 0.65 | 6 |
| 4 | 0.1 | 3 | 42 | 3 | 0.38 | 5 |

The printing plate was applied with a fountain solution all over the surface and printing was carried out by Heiderberg TOK offset printing machine using the same fountain solution.

The pH value of the surface of the lithographic printing plate subjected to the development and stabilization and the number of roll ups (prints) in which plate completely received the ink are shown in Table 9.

TABLE 9

| Stabilizing solution | pH of surface | The number of roll ups (prints) in which the plate completely received the ink |
|---|---|---|
| 1 | 8.3 | 20 |
| 2 | 9.4 | 13 |
| 3 | 7.8 | 34 |
| 4 | 8.2 | 33 |

When the stabilizing solution contains at least one nitrogen-containing heterocyclic compound having a mercapto group or a thione group in the processing method of the present invention, the ink-receptivity is further improved.

Industrial Applicability

According to the present invention, lithographic printing plates of high printing endurance can be made by rapid processing, with easy maintenance using a very small amount of processing solution with producing little waste solution and without drifting of image or producing drag patterns.

We claim:

1. A method for processing a photosensitive material which comprises dipping an exposed photosensitive material in a processing solution with at least a top end portion thereof being dipped for 1.5 second or less, removing the photosensitive material from the processing solution and coating a predetermined amount of the processing solution on the photosensitive material by a means for metering-coating.

2. A method according to claim 1, wherein the time from when the top end portion of the photosensitive material enters the processing solution to when the photosensitive material passes the metering-means is 1.5 second or less.

3. A method according to claim 1, wherein at least the top end portion of the photosensitive material is dipped in the processing solution,
the photosensitive material is removed from the processing solution in such a manner that the top end portion takes up the processing solution,
a reservoir of the processing solution is formed with the solution taken up on the photosensitive material, and
a predetermined amount of the processing solution is coated on the photosensitive material by the metering-coating means.

4. A method according to claim 1, wherein the amount of the processing solution coated on the photosensitive material is 20–50 ml/m².

5. A method according to claim 1, wherein the processing solution is continuously supplied during at least processing of the photosensitive material.

6. A method according to claim 3, wherein the processing solution is continuously supplied to the reservoir of the processing solution.

7. A method according to claim 1, wherein the metering-coating means is a wire bar.

8. A method according to claim 1, wherein the processing solution is coated on the photosensitive material by the metering-coating means and thereafter, the processing solution is present on the photosensitive material for 5 seconds or more.

9. A method according to claim 1, wherein the photosensitive material is heated before it is dipped in the processing solution.

10. A method according to claim 1, wherein the photosensitive material is a photosensitive lithographic printing plate having a silver halide emulsion layer which is subjected to a silver complex diffusion transfer process.

11. A method according to claim 10, which comprises dipping an exposed photosensitive lithographic printing plate in a developer with at least the top end portion thereof being dipped for 1.5 second or less, taking out the lithographic printing plate from the developer, coating a predetermined amount of the developer on the lithographic printing plate by the metering-coating means, maintaining the developer on the lithographic printing plate for 5 seconds or more, removing the developer deposited on the lithographic printing plate, successively dipping the lithographic printing plate in a stabilizing solution with at least the top end portion thereof being dipped for 1.5 second or less, removing the lithographic printing plate from the solution, coating a predetermined amount of the stabilizing solution on the lithographic printing plate by the metering-coating means, maintaining the stabilizing solution on the lithographic printing plate for 5 seconds or more, and removing the developer deposited on the lithographic printing plate.

12. A method according to claim 10, wherein the photosensitive lithographic printing plate is a lithographic printing plate to be processed with an alkaline activator.

13. A method according to claim 10, wherein the developer contains at least one alkanolamine represented by the following formula (1) and at least one diamine compound represented by the following formula (2):

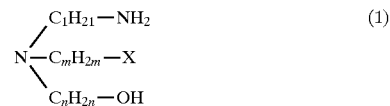

(1)

wherein 1 represents an integer of 1–8, m represents an integer of 0–8, n represents an integer of 1–8, and X represents a hydrogen atom or a hydroxyl group,

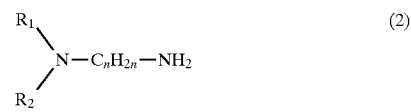

(2)

wherein n represents an integer of 2–8, and $R_1$ and $R_2$ each represent a hydrogen atom or an alkyl group of 1–6 carbon atoms with a proviso that $R_1$ and $R_2$ cannot be simultaneously hydrogen atom.

14. A method according to claim 10, wherein the developer contains at least one benzotriazole derivative compound represented by the following formula (3):

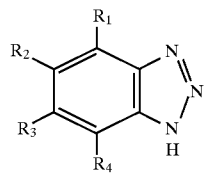

(3)

wherein $R_1$–$R_4$ each represent a hydrogen atom, an alkyl group of 5 or less carbon atoms, an amino group, a hydroxyl group, a carboxyl group, a sulfonic acid group, an alkoxycarbonyl group of 13 or less carbon atoms, an acylamide group of 10 or less carbon atoms or a sulfonamide group.

15. A method according to claim 10, wherein the developer contains at least one of polyoxethylene compounds represented by the following formulas (4), (5) and (6):

(4)

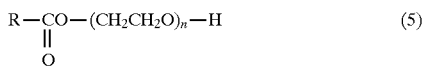

(5)

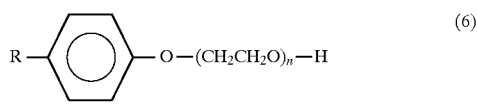

(6)

wherein n is 4–500 and R represents a hydrogen atom or an alkyl group of 1–20.

16. A method according to claim 11, wherein the silver complex diffusion transfer process results in transfer of silver halide complexes to image receiving layers and the stabilizing solution contains at least one nitrogen-containing heterocyclic compound having a mercapto group or a thione group.

17. A method according to claim 16, wherein the stabilizing solution has a pH of 4.5–6.5 and contains at least one buffer component at a concentration of 0.1–0.4 mol/l.

18. A method according to claim 17, wherein at least one of the buffer components is an amino acid.

19. A method according to claim 1, which comprises carrying out the processing by using a processing apparatus comprising a reservoir trough for the processing solution, a photosensitive material guiding means for horizontally carrying the photosensitive material into and out of the processing solution wherein the top end portion of the photosensitive material is dipped into the processing solution, and a metering-coating means for metering-coating the processing solution, the metering-coating means being provided at a position substantially just after the photosensitive material leaves the processing solution.

20. A method according to claim 19, wherein the photosensitive material guiding means in the processing apparatus is a roller and the metering-coating means is a wire bar.

21. A method according to claim 19, wherein the reservoir trough in the processing apparatus is a temporary reservoir trough which stores a predetermined amount of the processing solution substantially only at the time of processing.

22. A method according to claim 21, wherein the processing apparatus has a means for supplying the processing solution above the temporary reservoir trough and a means for discharging the processing solution in the temporary reservoir trough.

23. A method according to claim 19, wherein the photosensitive material guiding means and the metering-coating means for the processing solution are rollers having a diameter of 5 mm or more wherein the two rollers are arranged close to each other.

24. A method according to claim 23, wherein the two rollers are arranged at an interval of 1 mm or less, the processing solution is supplied through the space between the two rollers, and excess processing solution is recovered, recirculated and again used as the supplied processing solution.

25. A method according to claim 19, wherein the processing apparatus has a heating means for heating the photosensitive material and controlling the temperature of the processing solution substantially just before the photosensitive material is processed.

26. A method according to claim 19, wherein the processing apparatus has an overflow reservoir trough to catch processing solution which overflows at least during the time of processing, a means for recovering the overflow processing solution and a circulating means for supplying the recovered processing solution to the reservoir trough of the processing solution.

27. A method according to claim 26, wherein at least one of the recovering means and the circulating means has a means for controlling the temperature of the processing solution.

28. A method according to claim 26, wherein at least one of the recovering means and the circulating means has a means for replenishing the processing solution.

29. A method according to claim 19, wherein the photosensitive material is a photosensitive lithographic printing plate having a silver halide emulsion layer to be subjected to silver complex diffusion transfer process.

30. A method according to claim 29, wherein the processing apparatus has a reservoir trough for the developer, a photosensitive material guiding means for horizontally carrying the photosensitive lithographic printing plate into and out of the processing solution wherein the top end portion of the photosensitive lithographic printing plate is dipped into the developer, a metering-coating means for metering-coating the developer provided at a position substantially just after the photosensitive lithographic printing plate leaves the processing solution, a reaction maintaining means for maintaining the developer on the photosensitive lithographic printing plate for 5 seconds or more, a squeeze roller for removing the developer on the photosensitive lithographic printing plate, a reservoir trough for the developer, a photosensitive material guiding means for horizontally carrying the photosensitive lithographic printing plate into and out of the stabilizing solution wherein the top end portion of the photosensitive lithographic printing plate is dipped into the stabilizing solution, a metering-coating means for metering-coating the stabilizing solution provided at a position substantially just after the photosensitive lithographic printing plate leaves the stabilizing solution, a reaction maintaining means for maintaining the stabilizing solution on the photosensitive lithographic printing plate for 5 seconds or more, a squeeze roller for removing the stabilizing solution on the photosensitive lithographic printing plate, and a drying means.

* * * * *